US009628002B2

(12) United States Patent
Pjetar et al.

(10) Patent No.: US 9,628,002 B2
(45) Date of Patent: Apr. 18, 2017

(54) CIRCUIT AND METHOD FOR DETECTING MISSED COMMUTATION OF A BRUSHLESS DC MOTOR

(71) Applicant: Cirrus Logic, Inc., Austin, TX (US)

(72) Inventors: Branislav Pjetar, Novi Sad (SR); Marc J. Kobayashi, Tucson, AZ (US)

(73) Assignee: CIRRUS LOGIC, INC., Austin, TX (US)

( * ) Notice: Subject to any disclaimer, the term of this patent is extended or adjusted under 35 U.S.C. 154(b) by 227 days.

(21) Appl. No.: 14/208,277

(22) Filed: Mar. 13, 2014

(65) Prior Publication Data

US 2014/0312816 A1 Oct. 23, 2014

Related U.S. Application Data

(60) Provisional application No. 61/778,863, filed on Mar. 13, 2013.

(51) Int. Cl.
*H02P 27/00* (2006.01)
*H02P 6/12* (2006.01)
(Continued)

(52) U.S. Cl.
CPC ............. *H02P 6/12* (2013.01); *G01R 31/343* (2013.01); *H02P 6/182* (2013.01); *G01R 31/42* (2013.01)

(58) Field of Classification Search
CPC .. H02P 6/007; H02P 6/12; H02P 6/145; H02P 6/147; H02P 25/082
(Continued)

(56) References Cited

U.S. PATENT DOCUMENTS 4,672,286 A * 6/1987 Williams .............. H02P 27/047
318/798
5,187,417 A * 2/1993 Minnich .................. H02P 6/06
318/400.12
(Continued)

OTHER PUBLICATIONS

Wang, et al,"A Position Detection Strategy for Sensorless Surface Mounted Permanent Magnet Motors at Low Speed Using Transient Finite-Element Analysis" IEEE Transactions on Magnetics, vol. 48 No. 2, Feb. 2012, pp. 1003-1006.
(Continued)

*Primary Examiner* — Eduardo Colon Santana
*Assistant Examiner* — Bickey Dhakal
(74) *Attorney, Agent, or Firm* — Hayes Soloway PC

(57) ABSTRACT

The system contains a controller unit comprising a memory device, a processing unit, and at least one analog-to-digital converter. A power stage has a plurality of switches, wherein the power stage receives a control signal from the control circuit and a power signal from a power source. The power stage drives two windings of the set of three stator windings to rotate a rotor and maintains one stator winding of the three stator windings undriven. The memory device stores a plurality of values for the driven current and a plurality of demodulated undriven winding voltages. The processing unit compares the plurality of values and periodically calculates a rotor sextant while the rotor rotates. The processing unit compares at least two demodulated undriven winding voltage values corresponding to at least two current values within the rotor sextant to calculate the rotor sextant parity and verify the calculation of the rotor sextant.

15 Claims, 11 Drawing Sheets

(51) Int. Cl.
*G01R 31/34* (2006.01)
*H02P 6/182* (2016.01)
*G01R 31/42* (2006.01)

(58) Field of Classification Search
USPC .......................................................... 318/244
See application file for complete search history.

(56) References Cited

U.S. PATENT DOCUMENTS

| | | | |
|---|---|---|---|
| 6,885,163 | B2 | 4/2005 | Heidrich |
| 6,982,534 | B2 | 1/2006 | Hahn et al. |
| 7,042,180 | B2 | 5/2006 | Terry et al. |
| 7,122,980 | B2 | 10/2006 | Kuroshima et al. |
| 7,274,161 | B2 | 9/2007 | Mori et al. |
| 7,486,037 | B2 | 2/2009 | Noh |
| 7,489,097 | B2 | 2/2009 | Fu et al. |
| 7,944,163 | B2 | 5/2011 | Okumura |
| 8,018,188 | B2 | 9/2011 | Schwarzkopf et al. |
| 8,040,095 | B2 | 10/2011 | Berto |
| 8,054,024 | B2 | 11/2011 | Hayashi et al. |
| 2005/0283324 | A1* | 12/2005 | Swanson ................ H02P 6/185 702/57 |
| 2010/0007297 | A1* | 1/2010 | Brown .................... H02P 6/182 318/400.32 |
| 2010/0060217 | A1 | 3/2010 | Ikeda et al. |
| 2010/0194329 | A1 | 8/2010 | Lu et al. |
| 2010/0207562 | A1 | 8/2010 | Spirk et al. |
| 2011/0050209 | A1 | 3/2011 | Nase |
| 2012/0249033 | A1 | 10/2012 | Qin |

OTHER PUBLICATIONS

Johnson et al, "Review of Sensorless Methods for Brushless DC", Copyright 1999 IEEE, pp. 143-150.
Ogasawara et al, "An Approach to Position Sensorless Drive for Brushless DC Motors", Copyright 1990 IEEE, pp. 443-447.
Holtz, "Initial Rotor Polarity Detection and Sensorless Control of PM Synchronous Machines", Copyright 2006 IEEE, pp. 2040-2047.
Chang et al, "A New Sensorless Starting Method for Brushless DC Motors without Reversing Rotation", Copyright 2007 IEEE, pp. 619-624.
Personn et al, "A New Standstill Position Detection Technique for Nonsalient Permanent-Magnet Synchronous Motors Using the Magnetic Anisotropy Method", Copyright Feb. 2007 IEEE Transaction on Magnetics, col. 43, No. 2, pp. 554-560.
Nakashima et al, "Sensorless Initial Rotor Position Estimation of Surface Permanent-Magnet Synchronous Motor", Copyright Nov./Dec. 2000, IEEE Transaction on Industry Applications, vol. 36, No. 6, pp. 1598.
Tanaka et al, "Initial Rotor Position Estimation for Surface Permanent Magnet Synchronous Motor", Copyright 2001 IEEE, pp. 2592.
Tursini et al, "Initial Rotor Position Estimation Method for PM Motors", Copyright Nov./Dec. 2003, IEEE Transactions on Industry Applications, vol. 39 No. 6, pp. 1630-1640.
Lee et al, "A New Starting Method of BLDC Motors Without Position Sensor", Copyright Nov./Dec. 2006 IEEE Transactions of Industry Applications, vol. 42 No. 6, pp. 1532.
Lee et al, "A New Starting Method of BLDC Motors without Position Sensor", Copyright 2004 IEEE, pp. 2397-2402.
Ha et al, "Sensorless Field-Orientation Control of an Induction Machine by High-Frequency Signal Injection", Copyright Jan./Feb. 1999, IEEE Transactions on Industry Applications, vol. 35 No. 1, pp. 45-51.
Jeong et al, "Initial Rotor Position Estimation of an Interior Permanent-Magnet Synchronous Machine Using Carrier-Frequency Injection Methods", Copyright Jan./Feb. 2005, IEEE Transactions on Industry Applications, vol. 41 No. 1, pp. 38-45.
Wijenayake et al, "Modeling and Analysis of Permanent Magnet Synchronous Motor by Taking Saturation and Core Loss into Account", Copyright 1997 IEEE, pp. 530-534.
Schmidt et al, "Initial Rotor Angle Detection of a Non-Salient Pole Permanent Magnet Synchronous Machine", Copyright Oct. 1997, IEEE Industry Application Society Annual Meeting, pp. 459-463.
Jang et al, "Position Detection and Start-up Algorithm of a Rotor in a Sensorless BLDC Motor Utilising Inductance Variation". IEE Proc.-Electr. Power Appl., vol. 149, No. 2, Mar. 2002.
Nakashima et al, "Sensorless Initial Rotor Position Estimation of Surface Permanent Magnet Synchronous Motor", Copyright 1999 IEEE, pp. 525-527.
Sugawata et al, "A Novel and Simple Initial Rotor Position Detecting Method for PMSMs", Copyright 2005 IEEE PEDS, pp. 612-617.
Li et al, "Modeling of Cross-Coupling Magnetic Saturation in Signal-Injection-Based Sensorless Control of Permanent-Magnet Brushless AC Motors", Copyright Jun. 2007, IEEE Transactions on Magnetics, vol. 43 No. 6, pp. 2552-2554.
Consoli et al, "Sensorless Control of PM Synchronous Motors at Zero Speed", Copyright 1999 IEEE, pp. 1033-1040.
Ichikawa et al, "Sensorless Control of Permanent-Magnet Synchronous Motors Using Online Parameter Identification Based on System Identification Theory", Copyright Apr. 2006, IEEE Transactions on Industrial Electronics, vol. 53 No. 2, pp. 363-372.
Scaglione et al, "PM Motor Sensorless Position Detection based on Iron B—H Local Hysteresis"(Switzerland 2000), 6 pages.
Hung et al, "Fuzzy Gain Scheduling PI Controller for a Sensorless Four Switch Three Phase BLDC Motor", Copyright 2010 IEEE, pp. 420-424.
Novak et al., Designing High-Performance and Power-Efficient Motor Control Systems, Texas Instruments, Jun. 2009, p. 1-9, Texas Instruments Incorporated, Dallas, Texas.

* cited by examiner

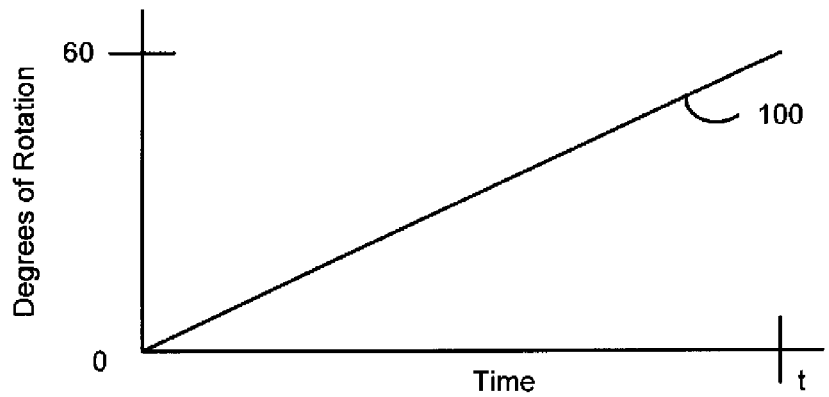
FIG. 2A - PRIOR ART
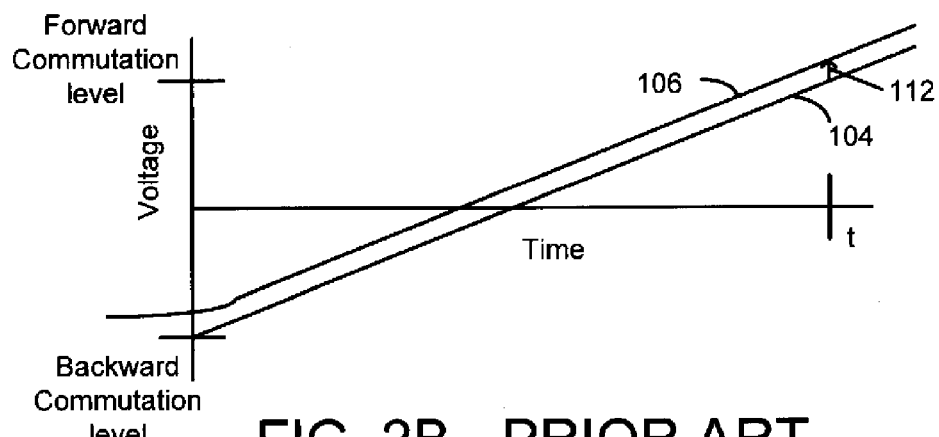
FIG. 2B - PRIOR ART
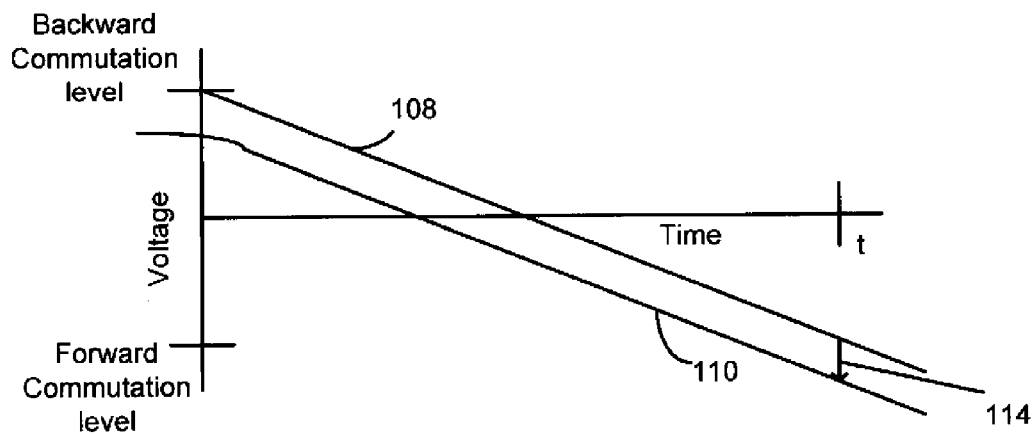
FIG. 2C - PRIOR ART

300

```
┌─────────────────────────────────────────────────────────────────────┐
│ A rotor in a motor is driven based on a calculated sextant of the rotor, │
│  wherein the calculated sextant has a calculated sextant parity.    │
│                              302                                    │
└─────────────────────────────────────────────────────────────────────┘
                                  │
┌─────────────────────────────────────────────────────────────────────┐
│           The motor is tested to determine a sextant parity.        │
│                              304                                    │
└─────────────────────────────────────────────────────────────────────┘
                                  │
┌─────────────────────────────────────────────────────────────────────┐
│ The calculated sextant parity is compared to the determined sextant parity. │
│                              306                                    │
└─────────────────────────────────────────────────────────────────────┘
                                  │
┌─────────────────────────────────────────────────────────────────────┐
│ If the calculated parity is different from the determined parity, the sextant │
│                   of the rotor is recalculated.                     │
│                              308                                    │
└─────────────────────────────────────────────────────────────────────┘
```

```
┌─────────────────────────────────────────────────────────────┐
│ A first current flowing in a first winding of the set of    │
│ three windings is determined.                               │
│                            402                              │
└─────────────────────────────────────────────────────────────┘
                              │
┌─────────────────────────────────────────────────────────────┐
│ A first voltage of an undriven winding of a set of three    │
│ windings is measured, wherein the first voltage is related  │
│ to the first current.                                       │
│                            404                              │
└─────────────────────────────────────────────────────────────┘
                              │
┌─────────────────────────────────────────────────────────────┐
│ The first winding is driven with a voltage to achieve a     │
│ second current, wherein the second current is materially    │
│ different from the first current.                           │
│                            406                              │
└─────────────────────────────────────────────────────────────┘
                              │
┌─────────────────────────────────────────────────────────────┐
│ A second voltage of the undriven winding of a set of three  │
│ windings is measured, wherein the second voltage is related │
│ to the second current.                                      │
│                            408                              │
└─────────────────────────────────────────────────────────────┘
                              │
┌─────────────────────────────────────────────────────────────┐
│ The first voltage is compared to the second voltage to      │
│ determine the rotor sextant parity.                         │
│                            410                              │
└─────────────────────────────────────────────────────────────┘
```

A first current flowing in a first winding of the set of three windings is measured within an initial sextant. 602

A first voltage of an undriven winding of a set of three windings is measured, wherein the first voltage is related to the first current. 604

The first winding is driven with a voltage to achieve a second current within the initial sextant, wherein the second current is materially different from the first current. 606

A second voltage of the undriven winding is measured, wherein the second voltage is related to the second current. 608

The rotor progresses to another sextant. 610

A third current in a driven winding of the set of three windings within the another sextant is determined. 612

A third voltage of the undriven winding of the set of three windings is measured, wherein the third voltage is related to the third current. 614

The driven winding is driven with a voltage to achieve a fourth current during the another sextant, wherein the fourth current is materially different from the third current. 616

From FIG. 9A

A fourth voltage of the undriven winding is measured, wherein the fourth voltage is related to the fourth current. 618

A first magnitude of a difference between the first voltage and the second voltage is compared with a second magnitude of a difference between the third voltage and the fourth voltage. 620

The greater magnitude of a difference is determined to determine rotor sextant parity. 622

FIG. 9B

CIRCUIT AND METHOD FOR DETECTING MISSED COMMUTATION OF A BRUSHLESS DC MOTOR

CROSS-REFERENCE

This application claims the benefit of U.S. Provisional Application entitled, "Method of Detecting Missed Commutation of a Rotor When Using Demodulated Position Signal for Commutation," having U.S. Ser. No. 61/778,863, filed Mar. 13, 2013, which is entirely incorporated herein by reference.

FIELD

The present disclosure is generally related to motor controllers, and more particularly is related to a system and method for sensorless control of a permanent magnet brushless motor.

BACKGROUND

Sensored brushless motor technology is well-known and is useful for minimal flaw control at low speeds and reliable rotation. A sensored system has one or more sensors that continuously communicate with a motor controller, indicating to it what position the rotor is in, how fast it is turning, and whether it is going forward or reverse. In trapezoidal drive, position of the rotor is determined by sextant. FIGS. 1A and 1B are representations of the six sextants of the rotor position, as is known in the prior art.

FIG. 1A is an illustration of a wye-connected motor 30, as is known in the prior art. The wye-connected motor 30 in this illustration has a single-pole pair permanent magnet rotor 32 positioned such that its south pole 34 is proximate to the winding of the U-phase 36. Under these conditions, it is obvious to one skilled in the art that the W-phase 38 and the V-phase 40 are the appropriate phase pair to drive in order to initiate rotation of the rotor 32. Hence, the power stage 16 connects the W-phase 38 to $V_{pwr}$ and the V-phase 40 to ground 24 resulting in current flow into the W-phase 38 and exiting the V-phase 40, as represented with the current arrows. A net effect of current flowing through coils W-phase 38 and V-phase 40 as shown in FIG. 2 is the formation of an electromagnet having a north pole at the W-phase 38 and a south pole at V-phase 40. This electromagnet produces a repulsive force between permanent magnet N-pole 42 and the electromagnet N-pole formed at the W-phase 38 and an attractive force between permanent magnet N-pole 42 and the electromagnet S-pole formed at the V-phase 38.

As N- and S-poles are attracted to each other, if the electromagnet persisted long enough in this current flow configuration, the resulting torque will move the permanent magnet N-pole 42 to a position shortly after the V-phase 40 and the permanent magnet S-pole 34 to a position shortly before the W-phase and rotation of the permanent magnet rotor 32 would stop. To perpetuate rotation of the permanent magnet rotor 32, the power stage 16 must commutate to a new phase pair. The optimum commutation point is a function of the rotor position relative to the coil of the undriven phase (the phase not driven by $V_{pwr}$). In FIG. 2, the U-phase 36 is the undriven phase. Ideally, the rotor angle would span −30° to +30° with respect to alignment with the coil of the undriven phase. As this 60° span is one sixth of one electrical revolution, it is commonly referred to as one sextant.

FIG. 1B is a 6-step commutation process further defined by Table 1, as is known in the prior art. Given the conditions illustrated in FIG. 1A, a high level description of the sequence of steps commonly referred to as 6-step commutation process is outlined in Table 1 and further illustrated in FIG. 1B.

Table 1. Six-step commutation sequence for a wye-connected motor shown in

| FIG. 1A | | | | |
|---|---|---|---|---|
| Sequence Step | Driven Phase Pair | N-pole position relative to phases | S-pole position relative to phases | Rotor Angle |
| 0 | WV | W + 30° to V − 30° | U − 30° to U + 30° | 1.25-1.75 |
| 1 | WU | V − 30° to V + 30° | U + 30° to W − 30° | 1.75-2.25 |
| 2 | VU | V + 30° to U − 30° | W − 30° to W + 30° | 2.25-2.75 |
| 3 | VW | U − 30° to U + 30° | W + 30° to V − 30° | 2.75-0.25 |
| 4 | UW | U + 30° to W − 30° | V − 30° to V + 30° | 0.25-0.75 |
| 5 | UV | W − 30° to W + 30° | V + 30° to U − 30° | 0.75-1.25 |

The 6-step commutation sequence results in one electrical revolution. Given this simplified example, it is understood that a properly driven permanent magnet rotor will be driven one mechanical revolution when this six-step process is complete. An increase in number of pole pair results in an equivalent increase in the number of electrical revolutions per mechanical revolution. Comparing Table 1 and FIG. 1A, it is understood that FIG. 1A illustrates Sequence Step 0 with the permanent magnet N-pole 42 pushed from the W-phase 38 and pulled by the attraction to the V-phase 40. When the permanent magnet S-pole 34 reaches the U+30° position, the power stage 16 commutates to Sequence Step 1 driving current from the W-phase 38 to the U-phase 36 causing the U-phase to become the electromagnetic S-pole. Thus, the U-phase 36 repels or pushes the permanent magnet S-pole 34 and the W-phase 38 attracts the S-pole, continuing the clockwise motion of the permanent magnet rotor 32. The sextant parity of Sequence Steps 0, 2, and 4 is even and the sextant parity of Sequence Steps 1, 3, and 5 is odd.

Sensors in a sensored system make it easy to determine rotor position, but increase cost and provide additional pieces that can break or wear down, adding durability and reliability issues. Sensorless systems will instead measure signals on the power connections to determine rotation and speed. Sensorless systems work well controlling motors at higher speeds (e.g., revolutions per minute ("RPM")), but often suffer control issues at low speeds, resulting in a low speed performance inferior to sensored brushless motors.

There are several well-known methods for driving a three-phase brushless direct current (DC) or permanent magnet alternating current (AC) motor without using hall-effect sensors, optical sensors, or resolvers. Several known methods for determining the position of the rotor can be used to determine which sextant to drive. Once the initial position is known, the problem remains of how to determine when to commutate to the next sextant. The aforementioned sensorless methods rely on the back electro-motive force (BEMF) signal that the motor generates to determine when to commutate the motor for continuous torque and smooth rotation. One example is a BEMF zero crossing technique, where the time measured from commutation to the point where the voltage on the undriven phase crosses a reference level or threshold is then used to determine commutation for that sextant.

However, the BEMF signal on which these control schemes rely is proportional to the speed of the motor.

Consequently, at standstill or very low speed, the BEMF signal is too small to be used to determine when to commutate the motor. Thus, sensorless motors have control issues at low motor speeds.

One solution to the standstill/low speed issues is to use the voltage difference between the energizing phase and the de-energizing phase of the pulse width modulation signal that appears on the undriven phase. This demodulated undriven winding voltage signal can be used to derive the commutation point of the rotor. FIGS. 2A, 2B, and 2C illustrate the underpinning of this solution. FIG. 2A is an illustration of the rotating rotor position 100 of a motor over time, as is known in the prior art. The rotor rotates 360 degrees in a single electrical revolution and a single sextant is ⅙ of an electrical revolution or 60 degrees. Thus, FIG. 2A illustrates the rotor position 100 over the time required for the rotor to rotate through one sextant.

FIG. 2B is an illustration of the demodulated undriven winding voltage signal 104 over the same time period illustrated in FIG. 2A if the sextant parity is even, as is known in the prior art. An even sextant is one in which the demodulated undriven winding voltage increases as the rotor moves forward from the beginning of the sextant to the end the sextant while driven windings maintain a relatively constant current, as in FIG. 2B. The forward commutation level is the threshold at which the motor drive should advance to the next sextant and the backward commutation level is the threshold at which the motor drive should retreat to the previous sextant (as can happen when trying to overcome significant torque in the opposite direction of the desired direction of movement). The demodulated undriven voltage signal 104 is a good approximation of the expected signal when torque impeding rotation of the rotor and current flowing in the motor are near zero in an even sextant.

FIG. 2C is an illustration of the demodulated undriven winding voltage signal 108 over the same time period illustrated in FIG. 2A if the sextant parity is odd, as is known in the prior art. An odd sextant is one in which the demodulated undriven winding voltage decreases as the rotor moves forward from the beginning of the sextant to the end while driven windings maintain a relatively constant current, as in FIG. 2C. The forward commutation level is the threshold at which the motor is expected to advance to the next sextant and the backward commutation level is the threshold at which the motor would be expected to retreat to the previous. The demodulated undriven voltage signal 108 is a good approximation of the expected signal when torque impeding rotation of the rotor and current flowing in the motor are near zero in an odd sextant.

The demodulated undriven voltage signal 104, 108 gives only the relative position of the rotor and not the absolute position. Distortion in the demodulated undriven voltage signal 104, 108 can cause the system to miss or fail to recognize the commutation point. Distortion is introduced to the demodulated undriven voltage signal 104, 108 when a materially greater than zero current drives the motor. As illustrated in FIG. 2B, a distorted demodulated undriven voltage signal 106 is shifted by a positive magnitude relative to the undistorted signal 104. As can be observed along the distorted demodulated undriven voltage signal 106, distortion can cause distorted signal 106 to prematurely reach the forward commutation level leading to the premature commutation to the next sextant. Similarly, distortion can inhibit the distorted signal 106 from reaching the backward commutation level, which can cause the motor controller to fail to commutate to the prior sextant. Looking to the distorted demodulated undriven voltage signal 110 in FIG. 2C, illustrates a negative magnitude shift relative to the undistorted signal 108 that can similarly lead to premature commutation to the next sextant and failure to commutate to the prior sextant. If a backward commutation point is missed, then it is possible for the controller to start driving the motor backwards unintentionally, which can damage the equipment and/or user utilizing the motor. It is paramount a missed commutation point be detected and corrected.

Thus, a heretofore unaddressed need exists in the industry to address the aforementioned deficiencies and inadequacies.

SUMMARY

Embodiments of the present disclosure provide a system and method for monitoring for missed commutation points while driving a set of stator windings of a multi-phase sensorless brushless motor. Briefly described, in architecture, one embodiment of the system, among others, can be implemented as follows. The system contains a controller unit comprising a memory device, a processing unit, and at least one analog-to-digital converter. A control circuit is in communication with the controller unit. A power stage has a plurality of switches, wherein the power stage receives a control signal from the control circuit and a power signal from a power source. The power stage drives two windings of the set of three stator windings to rotate a rotor and maintains one stator winding of the three stator windings undriven. A summing circuit is connected to the windings. A current sense circuit is connected to the power stage. Manipulation of the plurality of switches determines current flow from the power source through the windings. The memory device stores a plurality of values for the driven current and a plurality of demodulated undriven winding voltages. The processing unit compares the plurality of values and periodically calculates a rotor sextant while the rotor rotates. The processing unit compares at least two demodulated undriven winding voltage values corresponding to at least two current values within the rotor sextant to calculate the rotor sextant parity and verify the calculation of the rotor sextant.

The present disclosure can also be viewed as providing a method of detecting and correcting a missed commutation point. The method includes the steps of: driving a rotor in a motor based on a calculated sextant of the rotor, wherein the calculated sextant has a calculated sextant parity; testing the motor to determine a determined sextant parity; comparing the calculated sextant parity and the determined sextant parity; and recalculating the sextant of the rotor whereby the comparison shows the calculated parity is different from the determined parity.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale. Instead emphasis is being placed upon illustrating clearly the principles of the present disclosure. Moreover, in the drawings, like reference numerals designate corresponding parts throughout the several views.

FIG. 2A is an illustration of the rotor position of a motor over time, as is known in the prior art.

FIG. 2B is an illustration of the demodulated undriven winding voltage signal over the same time period illustrated in FIG. 2A if the sextant parity is even, as is known in the prior art.

FIG. 2C is an illustration of the demodulated undriven winding voltage signal over the same time period illustrated in FIG. 2A if the sextant parity is odd, as is known in the prior art.

FIG. 6 is an illustration of a first flowchart illustrating a method of detecting and correcting a missed commutation point using the motor control system of FIG. 3 or the motor control system of FIG. 8, in accordance with a first exemplary embodiment of the present disclosure.

FIG. 7 is an illustration of a second flowchart illustrating a method of detecting and correcting a missed commutation point using the motor control system of FIG. 3 or FIG. 8, in accordance with a first exemplary embodiment of the present disclosure.

FIGS. 9A and 9B are an illustration of a third flowchart illustrating a method of detecting and correcting a missed commutation point using the motor control system of FIG. 3 or FIG. 8, in accordance with a second exemplary embodiment of the present disclosure.

DETAILED DESCRIPTION

Figure 3:
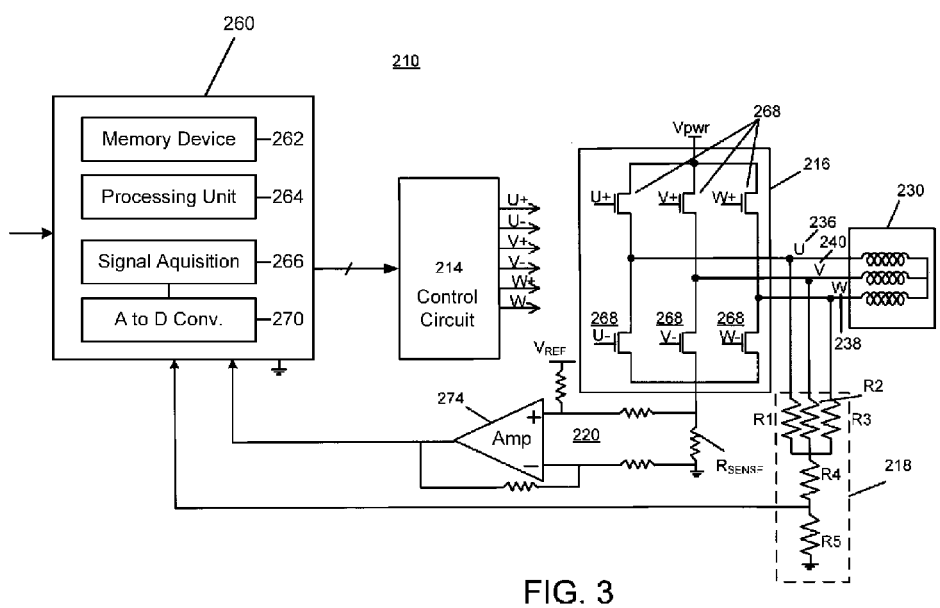
FIG. 3 is an illustration of a block diagram of a motor control system in a three-phase power stage, in accordance with a first exemplary embodiment of the present disclosure.

FIG. 3 is a block diagram of a motor control system 210 for a three-phase power stage 216 for a sensorless, brushless permanent magnet DC motor 230, in accordance with a first exemplary embodiment of the present disclosure. The motor control system 210 includes a controller unit 260 having a memory device 262, a processing unit 264, and at least one analog-to-digital convertor 270. A control circuit 214 is connected to the control unit 260. The control circuit 214 is a six input gate driver. The control circuit 214, which may be powered by an independent power source (not illustrated), controls six MOSFET switches 268 in the power stage 216. Manipulation of the switches determines current flow from the power source $V_{pwr}$ through the stator windings 236, 238, 240 in the motor 230.

The voltage sense circuit 218 and current sense circuit 220 are used for closed loop control of the motor. The power stage 216 has 6 switches grouped in pairs. Each switch pair is configured as a half bridge. Each switch has a control input. The outputs of power stage 216 are fed into the 3-phase BLDC motor windings U 236, V 240, W 238. The power stage 216 is supplied by a voltage source $V_{pwr}$ having a DC voltage, which the power stage uses to supply a pulse width modulation signal to the windings U 236, V 240, W 238. The current return path for the voltage source $V_{pwr}$ is through ground via current sense resistor $R_{SENSE}$. The power stage 216 for a trapezoidally controlled pulse width modulated brushless DC motor 230 typically energizes two motor windings of the set of three windings 236, 238, 240 at a time. Thus, when current is flowing through one driven winding, current is typically flowing through at least two of the windings.

A voltage signal is available at the undriven phase. This voltage signal can be used to generate a commutation signal by demodulating the undriven phase voltage synchronously with the PWM switching rate. The commutation signal, when a near-zero drive current is present, has a periodicity of ½ electrical revolutions. The shape of this commutation signal is related to the action of the permanent magnet rotor on the stator windings 236, 238, 240. Demodulation can be performed by simply taking the difference in voltage between the undriven phase and the switching in two different driven states of the PWM. When a materially-greater-than-zero magnitude current is driven into the active pair of terminals, the signal has an added component with a periodicity of a full electrical cycle.

A voltage sense circuit 218 may be used in conjunction with the motor control system 210. The voltage sense circuit 218 is placed in the feedback path of a first control loop, between the power stage outputs 216 and a controller unit signal acquisition device 266. The voltage sense circuit 218 includes a resistor network comprising resistors R1, R2, R3, R4, and R5 coupled together as shown in FIG. 3. Voltage sense circuit 218 has three inputs connected to three motor terminals, U 236, V 240, W 238. The voltage sense circuit 218 superposes motor voltage response from each phase 236, 238, 240 and divides the result to level in accordance with input requirements from signal acquisition 266. The result includes the voltage on the undriven phase. While similar motor control configurations include voltage sense circuits 218, these circuits are directed to retrieving a back EMF signal and regularly filtering out the undriven phase voltage to get a cleaner back EMF signal.

A current sense circuit 220 may be used in conjunction with the motor control system 210. The current sense circuit 220 is placed in the feedback path of a second control loop, between a current sense resistor $R_{SENSE}$ and the analog-to-digital convertor 270. The power supply voltage levels of current sense circuit 220 and controller unit 260 are approximately the same. Current sense circuit 220 includes an amplifier 274 configured for differential measurement of voltage across $R_{SENSE}$. The input common-mode voltage and gain for amplifier 274 are set such that amplifier output is at approximately mid-supply to facilitate monitoring of $R_{SENSE}$ current flowing in positive and negative direction.

The memory device 262 stores a plurality of values for the current and demodulated undriven winding voltages. The processing unit 264 compares the plurality of values and periodically calculates a rotor sextant while the rotor rotates. The processing unit 264 compares at least two demodulated undriven winding voltage values corresponding to at least two current values within the rotor sextant to calculate the rotor sextant parity and verify the calculation of the rotor sextant. When the processing unit 264 calculates the rotor sextant parity, which shows an error in the calculation of the rotor sextant, the processing unit 264 recalculates the rotor sextant based on this new information, as will be described further herein.

Figure 4:
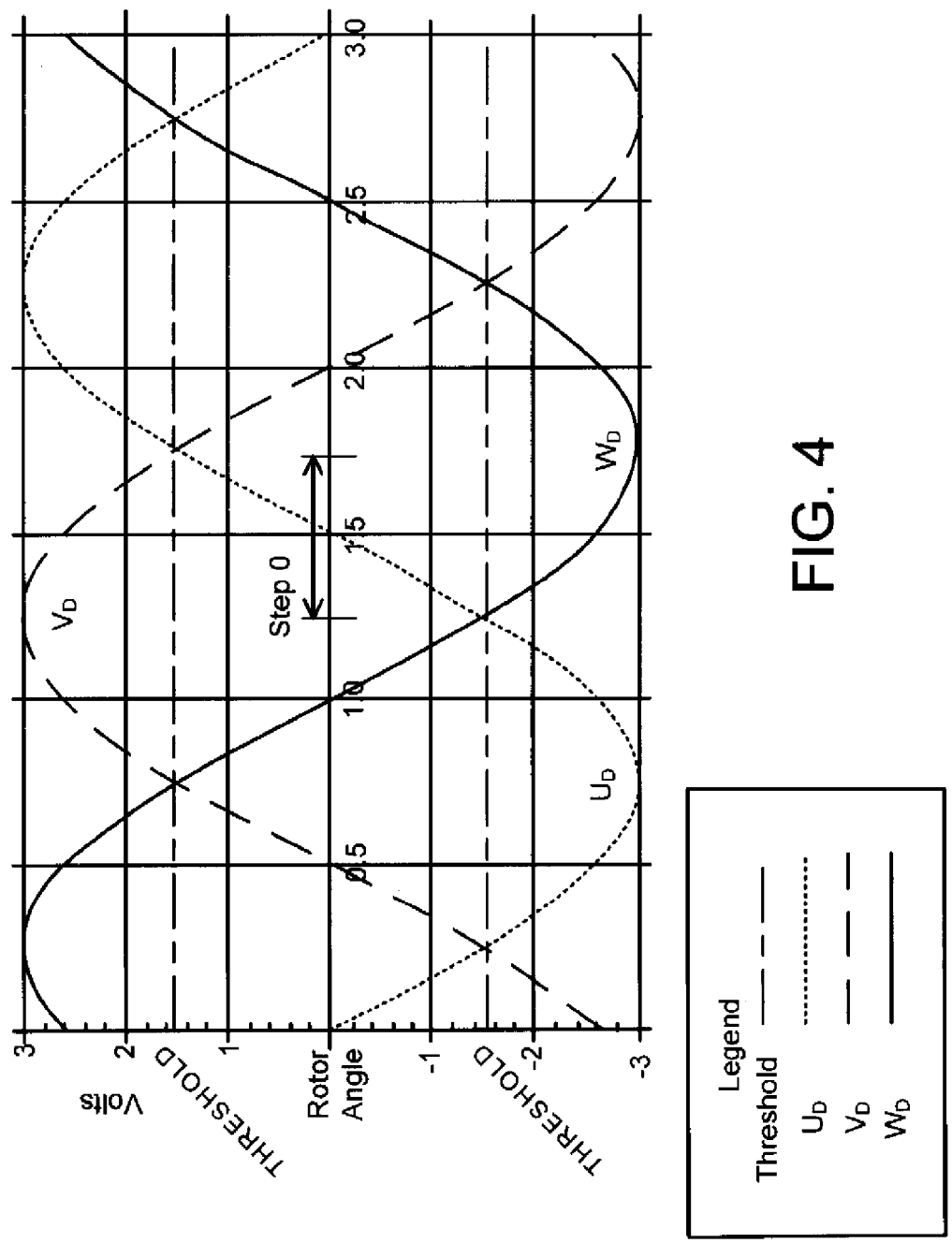
FIG. 4 is an illustration of demodulated undriven phase signals representing six motor phases similar to the illustrations in FIG. 2B-C.

FIG. 4 is an illustration of demodulated undriven phase signals representing six motor phases similar to the illustrations in FIGS. 2B-C. The subscript D indicates the signal is from a demodulated undriven winding. Here, the undriven phase signals are illustrated for a ½ electrical cycle superimposed upon each other relative to rotor angle. The proper commutation time can be determined by monitoring the undriven phase signal, derived from the demodulated undriven phase signal, and commutating at a value that is a function of the motor current. As the current increases, a comparison value will change, but FIG. 4 is representative of a near-zero current through the driven windings.

Figure 1A:
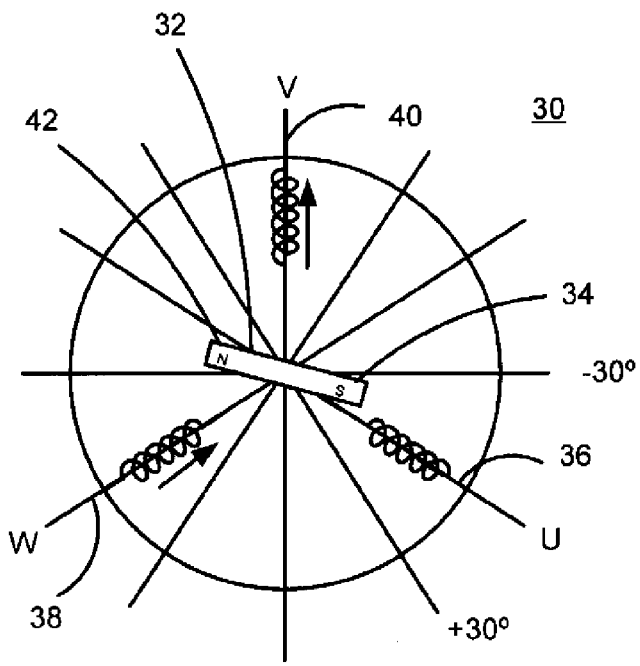
FIGS. 1A and 1B are representations of the six sextants of the rotor position, as is known in the prior art.
Figure 1B:
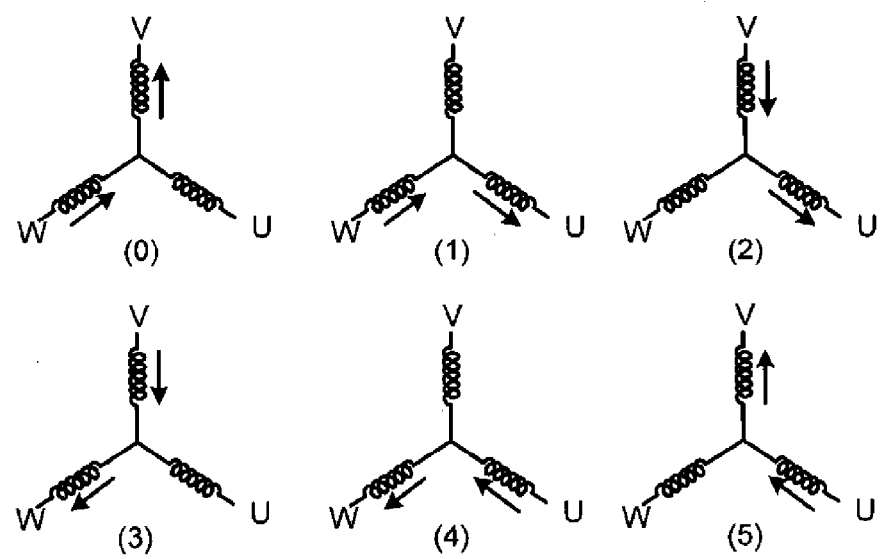

As illustrated in FIG. 4, the dotted line $U_D$ represents the demodulated signal produced when the U-phase 236 is disconnected during commutation sequence step 0, and the WV phases 238, 240 are driven with a PWM wave (illustrated in FIG. 1B, Sequence Step 0). This drive combination is the connection that generates the most torque from the rotation position 1.25 to the 1.75 point on the x-axis, as illustrated in FIG. 4, which is the sextant position.

If the motor is being driven with torque pushing to the right, when 1.75 point is reached, the motor is rotating in the proper direction, and commutation from WV phases to WU phases (e.g., respective commutation sequence steps 0 an 1 in FIG. 1B) should occur at the 1.75 point. Likewise, if the rotor is rotating counterclockwise while being electrically driven clockwise, such as starting an electric scooter on a hill, $U_D$ has negative slope between 1.25 and 1.75. If the 1.25 point is reached, the prior commutation phase UV (e.g., commutation sequence step 5 in FIG. 1B) should be switched in. These points are associated with the demodulated signal $U_D$, reaching approximately 1.5 or −1.5 volts for forward or reverse commutation respectively, illustrated as THRESHOLD in FIG. 4. When 1.75 on the x-axis is reached, upon commutating to WU phases, the demodulated signal associated with the V-phase 240, i.e. $V_D$, will then be generated. If 1.25 is reached (forced in reverse), the demodulated signal associated with the W phase, i.e. $W_D$, will then be generated.

If the commutation signal component from the permanent magnets is dominant, determining the time for commutation is straightforward. The commutation signal from the undriven phase is derived, and when pre-determined values are reached, the motor is advanced to the next or prior sextant. The prior sextant advance is important, as the load may be rotating in the direction opposite to the desired rotation upon start. For maximum torque, it is important that the commutation levels be relatively accurate to commutate the rotor to the proper sextant while maintaining torque to accelerate in the motor in the desired direction.

When the required starting torque is high, a materially-greater-than-zero current is needed through the driven windings to generate the high torque. The commutation breakpoint is harder to determine from the undriven phase signal when the driven winding current is high. The commutation signal transforms substantively with respect to rotational position when the current has surpassed a near-zero level.

Figure 5:
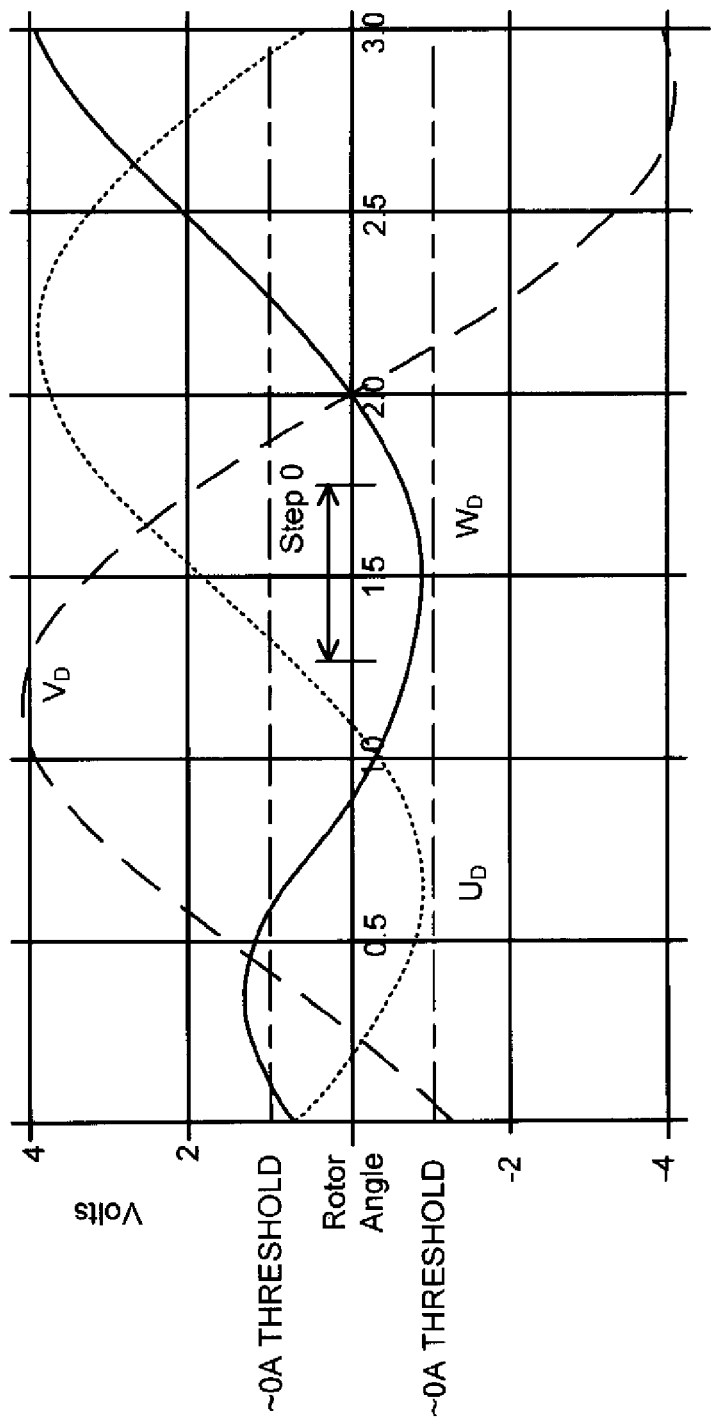
FIG. 5 is an illustration of demodulated undriven phase signals similar to FIG. 4, but under the influence of high torque and current.

FIG. 5 is an illustration of demodulated undriven similar to FIG. 4, but under the influence of high torque and current. The proper values for the demodulated undriven winding ($U_D$) signal at the previously identified commutation breakpoints (illustrated as Step 0 when the rotor angle is 1.25 and 1.75) are 1V and 3V. Thus, if the motor controller operates with a threshold of −1.5V and 1.5V for commutation, as was shown in FIG. 5, the motor would not commutate as intended. Rather than commutating at the intended angles of 1.25 and 1.75, forward commutation approximately at angle 1.3 and backward commutation would not occur because $U_D$ does not achieve the backward commutation threshold of −1.5V. Failure to commutate backward would lead the controller to errantly attempt to drive the motor in the wrong direction.

The effect of current on the demodulated signal may be different for even and odd sextants (as illustrated in FIGS. 2B and 2C). Specifically, motor characteristics indicate the portion of the demodulated signal associated with even sextants varies proportionally with current and the portion of demodulated signal associated with odd sextants varies inversely with current. This variance in effect can be utilized to monitor sextant parity, which in turn can be used to verify the motor is driven properly relative to rotor position.

Figure 8:
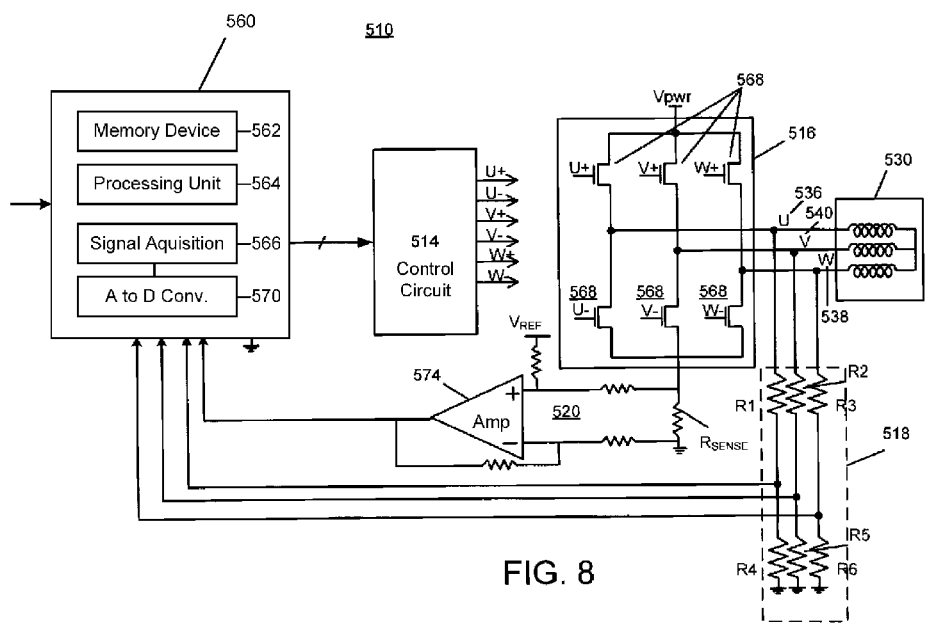
FIG. 8 is an illustration of a block diagram of a motor control system in a three-phase power stage, in accordance with a possible alternative to the first exemplary embodiment of the present disclosure.

FIG. 6 is an illustration of a first flowchart 300 illustrating a method of detecting and correcting a missed commutation point using the motor control system 210 of FIG. 3 or the motor control system 510 of FIG. 8, in accordance with a first exemplary embodiment of the present disclosure. It should be noted that any process descriptions or blocks in flowcharts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As shown in block 302, a rotor in a motor is driven based on a calculated sextant of the rotor, wherein the calculated sextant has a calculated sextant parity. The motor is tested to determine a sextant parity (block 304). The calculated sextant parity is compared to the determined sextant parity (block 306). If the calculated parity is different from the determined parity, the sextant of the rotor is recalculated (block 308).

As has been discussed thoroughly herein, sensorless motors calculate the rotor position and, thus, rotor sextant to drive the motor properly. Those calculations may be based on determining an initial rotor position and then monitoring commutation points. Current-related distortion and missed commutation points can result in incorrect calculation of the sextant and driving the motor based on an incorrect calculation of the sextant is hazardous. As used herein, sextant parity references the oddness or evenness of the sextant as determined by calculation. If the motor controller is operating with information the rotor is in an odd sextant and the testing reveals the rotor is in an even sextant, which constitutes a different sextant parity, the motor controller needs to correct its information by recalibrating the rotor position to reestablish efficient, non-flaw operation. FIGS. 7, 9A, and 9B illustrate methods of determining sextant parity.

FIG. 7 is an illustration of a second flowchart 400 illustrating a method of determining sextant parity using the motor control system 210 of FIG. 3 or the motor control system 510 of FIG. 8, in accordance with a first exemplary embodiment of the present disclosure. As is shown by block 402, a first current flowing in a first winding of the set of three windings is determined. A first voltage of an undriven winding of a set of three windings is measured, wherein the first voltage is related to the first current (block 404). The first winding is driven with a voltage to achieve a second current, wherein the second current is materially different from the first current (block 406). A second voltage of the undriven winding of a set of three windings is measured, wherein the second voltage is related to the second current (block 408). The first voltage is compared to the second voltage to determine the rotor sextant parity (block 410).

As explained previously, commutation points are more likely to be missed when rotor rotation is relatively slow and the driving current is high. The high driving current may be the first current, and it may be practical to make the second current a near zero current.

As illustrated in FIG. 2B and FIG. 2C, in an even sextant, the demodulated voltage is greater in the same rotor position when the driving current is greater. In an odd sextant, the demodulated voltage is lesser in the same rotor position when the driving current is greater. Thus, when testing the motor with the second current as described with the second flowchart 400, if the second current is less than the first current and the demodulated voltage displays a negative change, the current sextant must be an even sextant. Similarly, if the second current is less than the first current and the demodulated voltage displays a positive change, the current sextant must be an odd sextant. Prior to performing the test, the motor controller will have a calculated rotor position and a corresponding calculated rotor sextant. If the test reveals the rotor has a different sextant parity, then it recalibrates the rotor position to reestablish efficient, non-flaw operation.

FIG. 8 is an illustration of a block diagram of a motor control system 510 for a three-phase power stage 516 for a sensorless, brushless permanent magnet DC motor 530, in accordance with a first exemplary embodiment of the present disclosure. The motor control system 510 includes a controller unit 560 having a memory device 562, a processing unit 564, and an analog-to-digital convertor 570. A control circuit 514 is connected to the control unit 560. The control circuit 514 is a six input gate driver. The control circuit 514, which may be powered by an independent power source (not illustrated), controls six MOSFET switches 568 in the power stage 516. Manipulation of the switches determines current flow from the power source $V_{pwr}$ through the stator windings 536, 538, 540 in the motor 530.

Operation of the motor controller system 510 in FIG. 8 is comparable to the operation of the motor controller system 210 in FIG. 3. In the first motor controller system 210, voltage summation is performed in an analog form by the voltage sense circuit 218. In the second motor controller system 510, voltage summation is performed by the processor 564.

The voltage sense circuit 518 and current sense circuit 520 are used for closed loop control of the motor. The power stage 516 has 6 switches grouped in pairs. Each switch pair is configured as a half bridge. Each switch has a control input. The outputs of power stage 516 are fed into the 3-phase BLDC motor windings U 536, V 540, W 538. The power stage 516 is supplied by a voltage source $V_{pwr}$ having a DC voltage, which the power stage uses to supply a pulse width modulation signal to the windings U 536, V 540, W 538. The current return path for the voltage source $V_{pwr}$ is through ground via current sense resistor $R_{SENSE}$. The power stage 516 for a trapezoidally controlled pulse width modulated brushless DC motor 530 typically energizes two motor windings of the set of three windings 536, 538, 540 at a time.

A voltage signal is available at the undriven phase. This voltage signal can be used to generate a commutation signal by demodulating the undriven phase voltage synchronously with the PWM switching rate. The commutation signal, when a near-zero drive current is present, has a periodicity of ½ electrical revolutions. The shape of this commutation signal is related to the action of the permanent magnet rotor on the stator windings 536, 538, 540. Demodulation can be performed by simply taking the difference in voltage between the undriven phase and the switching in two different driven states of the PWM. When a materially-greater-than-zero magnitude current is driven into the active pair of terminals, the signal has an added component with a periodicity of a full electrical cycle.

A voltage sense circuit 518 may be used in conjunction with the motor control system 510. The voltage sense circuit 518 is placed in the feedback path of a first control loop, between the power stage outputs 516 and the controller unit signal acquisition device 566. The voltage sense circuit 518 includes a resistor network comprising resistors R1, R2, R3, R4, R5, and R6 coupled together as shown in FIG. 8. Voltage sense circuit 518 has three inputs connected to three motor terminals, U 536, V 540, W 538. The voltage sense circuit 518 superposes motor voltage response from each phase 536, 538, 540 and divides the result to level in accordance with input requirements from signal acquisition 566. The result includes the voltage on the undriven phase. While similar motor control configurations include voltage sense circuits 518, these circuits are directed to retrieving a back EMF signal and regularly filtering out the undriven phase voltage to get a cleaner back EMF signal.

A current sense circuit 520 may be used in conjunction with the motor control system 510. The current sense circuit 520 is placed in the feedback path of a second control loop, between a current sense resistor $R_{SENSE}$ and the controller unit signal acquisition device 566. The power supply voltage levels of current sense circuit 520 and controller unit 560 are approximately the same. Current sense circuit 520 includes an amplifier 574 configured for differential measurement of voltage across $R_{SENSE}$. The amplifier 574 input common-mode voltage and gain are set such that amplifier output is at approximately mid-supply to facilitate monitoring of $R_{SENSE}$ current flowing in positive and negative direction.

FIGS. 9A and 9B are an illustration of a third flowchart 600 illustrating a method of determining sextant parity using the motor control system of FIG. 3 or FIG. 8, in accordance with a second exemplary embodiment of the present disclosure. As is shown by block 602, a first current flowing in a first winding of the set of three windings within a first sextant is measured. A first voltage of an undriven winding of a set of three windings is measured, wherein the first voltage is related to the first current (block 604). The first winding is driven with a voltage to achieve a second current within the first sextant, wherein the second current is materially different from the first current (block 606). A second voltage of the undriven winding, wherein the second voltage is related to the second current (block 608). The rotor progresses to a second sextant (block 610). A third current flowing in a driven winding of the set of three windings within the second sextant is determined (block 612). A third voltage of the undriven winding of the set of three windings is measured, wherein the third voltage is related to the third current (block 614). The driven winding is driven with a voltage to achieve a fourth current during the second sextant, wherein the fourth current is materially different from the third current (block 616). A fourth voltage of the undriven winding is measured, wherein the fourth voltage is related to the fourth current (block 618). A first magnitude of a difference between the first voltage and the second voltage is compared with a second magnitude of a difference between the third voltage and the fourth voltage (block 520).

The greater magnitude of a difference is determined to determine rotor sextant parity (block 522).

As illustrated in FIG. 2B and FIG. 2C, the demodulated voltage on the undriven winding is different for all sextants when compared between a near zero driving current and a materially greater driving current. Also evident from these figures is that the magnitude of change in the demodulated undriven winding voltage is greater within odd sextants as compared to the even sextants. Specifically, the voltage difference between demodulated undriven voltage signals 108 and 110 in FIG. 2C (odd sextant) at Time=T is greater than the demodulated undriven voltage signals 104 and 106 in FIG. 2B (even sextant) at Time=T for the same current change.

Figure 10:
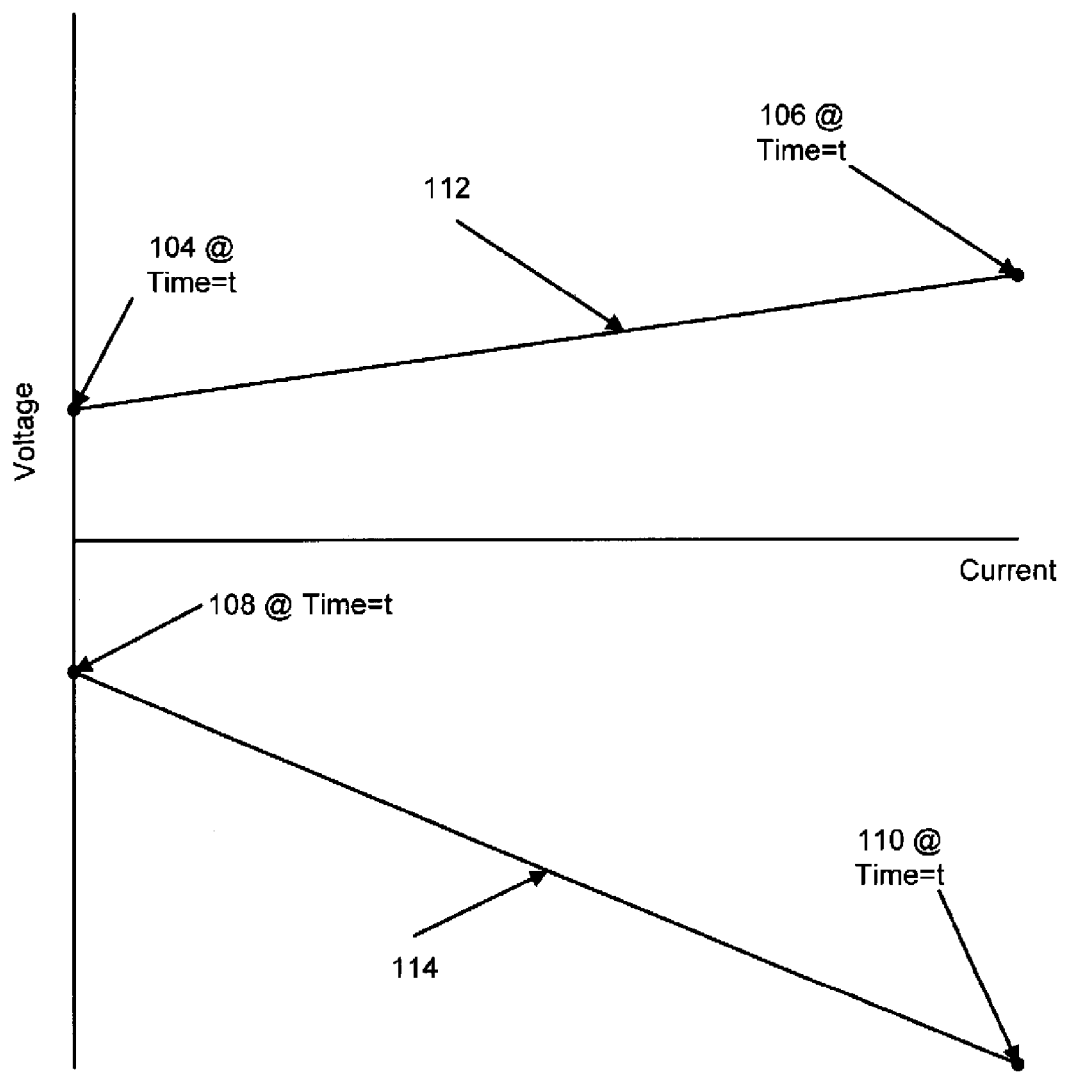
FIG. 10 is an illustration of the change in demodulated voltage of an undriven winding as a function of current, as illustrated in FIG. 2B and FIG. 2C.

FIG. 10 is an illustration of the change in demodulated voltage of an undriven winding as a function of current, as illustrated in FIG. 2B and FIG. 2C. As can be seen in FIG. 2B and FIG. 2C, the value of the demodulated voltage 108 is the negative or opposite of the value of the demodulated voltage 104. This relationship is similarly illustrated in FIG. 10. As current is increased, whether in the even sextant (FIG. 2B) or in the odd sextant (FIG. 2C), the demodulated voltage values distorted, but they distort differently in the even sextant as compared to the odd sextant. Even sextant distortion 112 in FIG. 10 varies from the odd sextant distortion 114. Even sextant distortion 112 is a positive value and odd sextant distortion 114 is a negative value. This difference is utilized in the test illustrated in the second flowchart 400. Also evident is that the slope of the even sextant distortion 112 is positive, while the slope of the odd sextant distortion is negative. Further, the magnitude (or absolute value) of the even sextant distortion 112 is less than the magnitude of the odd sextant distortion 114. Worded differently, the absolute value of the slope of the change in voltage over the change in current is greater in odd sextants than in even sextants. This difference is utilized in the test illustrated in the third flowchart 600.

Thus, when testing the motor with the second current within consecutive sextants as described with the third flowchart 600, the sextant that features the greater magnitude change in the demodulated undriven winding voltage will be the odd sextant. (It should be noted that the terms "first" and "second" within "first sextant" and "second sextant" are not indicative of whether the sextant is odd or even, but are simply used to differentiate testing that occurs within two different sextants.) Prior to performing the test, the motor controller will have a rotor position it believes the rotor occupies. If the test reveals the rotor is in a different sextant (e.g., the motor controller determines or identifies the rotor is in an odd sextant and the test reveals the rotor is in an even sextant), then the motor controller recalibrates the rotor position to reestablish efficient operation. If the controller is improperly driving the motor in reverse, then the sensorless controller will have record and information that the motor is in an even sextant. Thus, determining that the motor is truly in an odd sextant provides information to the sensorless controller that its recorded value is not correct and the rotor position should be recalibrated.

As explained previously, commutation points are more likely to be missed when rotor rotation is relatively slow and the driving current is high. The high driving current may be the first current and it may be practical to make the second current a near zero current. Further, the test may be more reliable if the first and third currents are equivalent and the second and fourth currents are equivalent. If the driving current varies at the time the various voltages are recorded, the voltage differences may be divided by the current differences (e.g., (|first voltage−second voltage|/|first current−second current|) and the resulting quotients are compared to determine rotor sextant parity. One having ordinary skill in the art will recognize other mathematical manipulations may be possible to compare these magnitudes appropriately based on other system variables and these other mathematical manipulations remain within the scope of the present disclosure.

When the rotor rotates fast enough, relative to other motor characteristics and operating conditions, a reliable back EMF signal becomes available. Use of a reliable back EMF signal to control commutation from driven pair to driven pair is well known in the art. Thus, the techniques disclosed herein are designed for monitoring commutation when the rotor is not moving significantly or is rotating at speeds below which a reliable back EMF signal is available. The motor control switches to the back EMF commutation technique when a rotational speed of the rotor surpasses a speed threshold such that the reliable back EMF signal is available.

It should be emphasized that the above-described embodiments of the present disclosure, particularly, any "preferred" embodiments, are merely possible examples of implementations, merely set forth for a clear understanding of the principles of the disclosed system and method. Many variations and modifications may be made to the above-described embodiments of the disclosure without departing substantially from the spirit and principles of the disclosure. All such modifications and variations are intended to be included herein within the scope of this disclosure and protected by the following claims.

What is claimed is:

1. A method of detecting and correcting a missed commutation point, the method comprising the steps of:
   driving, by a controller unit, a rotor in a motor based on a calculated sextant of the rotor, wherein the calculated sextant has a calculated sextant parity;
   testing, by the controller unit, the motor to determine a determined sextant parity,
   wherein the testing comprises the steps of:
      determining, by a current sense circuit, a first current flowing in a first winding of a set of three windings;
      measuring, by a voltage sense circuit, a first voltage of an undriven winding of a set of three windings;
      driving, by the controller unit, the first winding with a voltage to achieve a second current, wherein the second current is different from the first current;
      measuring, by the voltage sense circuit, a second voltage of the undriven winding of a set of three windings; and
      comparing, by the controller unit, the first voltage and the second voltage to determine the rotor sextant parity;
   comparing, by the controller unit, the calculated sextant parity and the determined sextant parity; and
   recalculating, by the controller unit, the sextant of the rotor whereby the comparison shows the calculated parity is different from the determined parity.

2. The method of claim 1, wherein the first voltage is greater than the second voltage and the first current is greater than the second current, thereby indicating the rotor is in an even sextant.

3. The method of claim 1, wherein the first current is a magnitude greater than zero.

4. The method of claim 1, further comprising storing the first voltage and the second voltage and the first current and the second current as values in a memory device and performing the comparing step with a processor.

5. The method of claim 1, wherein the second current is zero.

6. The method of claim 1, further comprising:
measuring the first voltage and the second voltage within a first sextant;
progressing to a second sextant;
determining, by the current sense circuit, a third current flowing in a driven winding of the set of three windings within the second sextant;
measuring, by the voltage sense circuit, a third voltage of the undriven winding of the set of three windings;
driving, by the controller unit, the driven winding with a voltage to achieve a fourth current during the second sextant, wherein the fourth current is different from the third current;
measuring, by the controller unit, a fourth voltage of the undriven winding;
comparing, by the controller unit, a first magnitude of a difference between the first voltage and the second voltage with a second magnitude of a difference between the third voltage and the fourth voltage;
determining, by the controller unit, which of the sextants exhibited the greater magnitude of a difference to define a second rotor sextant parity conclusion; and
recalibrating, by the controller unit, the rotor position based upon the rotor sextant parity determination and the second rotor sextant parity conclusion.

7. The method of claim 6, wherein the first magnitude of a difference is measured, by the controller unit, by determining the change in voltage divided by the change in current on the first sextant and the second magnitude of a difference is measured, by the controller unit, by determining the change in voltage divided by the change in current in the second sextant.

8. The method of claim 6, wherein the greater magnitude of a difference is within an odd sextant.

9. The method of claim 1, further comprising the step of identifying, by the controller unit, an expected rotor sextant parity and performing the step of recalibration.

10. A method of detecting and correcting a missed commutation point, the method comprising the steps of:
driving, by a controller unit, a rotor in a motor based on a calculated sextant of the rotor, wherein the calculated sextant has a calculated sextant parity;
testing, by the controller unit, the motor to determine a determined sextant parity, wherein the testing comprises;
measuring, by the current sense circuit, a first current flowing in a first winding of the set of three windings within a first sextant;
measuring, by the controller unit, a first voltage of an undriven winding of a set of three windings;
driving, by the controller unit, the first winding with a voltage to achieve a second current within the first sextant, wherein the second current is different from the first current;
measuring, by the voltage sense circuit, a second voltage of the undriven winding;
progressing to a second sextant;

determining, by the controller unit, a third current flowing in a driven winding of the set of three windings within the second sextant;
measuring, by the controller unit, a third voltage of the undriven winding of the set of three windings;
driving, by the controller unit, the driven winding with a voltage to achieve a fourth current during the second sextant, wherein the fourth current is materially different from the third current;
measuring, by the voltage sense circuit, a fourth voltage of the undriven winding;
comparing, by the controller unit, a first magnitude of a difference between the first voltage and the second voltage with a second magnitude of a difference between the third voltage and the fourth voltage;
determining, by the controller unit, which of the sextants exhibited the greater magnitude of a difference to determine rotor sextant parity;
comparing, by the controller unit, the calculated sextant parity and the determined sextant parity; and
recalculating, by the controller unit, the sextant of the rotor whereby the comparison shows the calculated parity is different from the determined parity.

11. The method of claim 10, further comprising storing the first, second, third, and fourth voltages and the first, second, third, and fourth currents as values in a memory device and performing the comparing and determining steps with a processor.

12. The method of claim 11, wherein the greater magnitude of a difference is within an odd sextant.

13. The method of claim 11, wherein the step of comparing further comprises deriving the magnitude as slopes comprising:
dividing the difference between the first voltage and the second voltage by a difference between the first current and the second current to obtain a first slope;
dividing the difference between the third voltage and the fourth voltage by a difference between the third current and the fourth current to obtain the second slope; and
comparing, by the controller unit, an absolute value of first slope to an absolute value of the second slope.

14. The method of claim 10, wherein the first and third currents are equivalent and the second and fourth currents are equivalent.

15. A method of detecting and correcting a missed commutation point, the method comprising the steps of:
determining, by a current sense circuit, a first current flowing in a first winding of a set of three windings;
measuring, by a voltage sense circuit, a first voltage of an undriven winding of a set of three windings;
driving, by a controller unit, the first winding with a voltage to achieve a second current, wherein the second current is different from the first current;
measuring, by the voltage sense circuit, a second voltage of the undriven winding of a set of three windings; and
comparing, by the controller unit, the first voltage and the second voltage to determine the rotor sextant parity; and
recalibrating, by the controller unit, a rotor position based upon the rotor sextant parity determination.

* * * * *